(12) United States Patent
Lue

(10) Patent No.: US 10,403,637 B2
(45) Date of Patent: Sep. 3, 2019

(54) DISCRETE CHARGE TRAPPING ELEMENTS FOR 3D NAND ARCHITECTURE

(71) Applicant: MACRONIX INTERNATIONAL CO., LTD., Hsinchu (TW)

(72) Inventor: Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 17 days.

(21) Appl. No.: 15/410,965

(22) Filed: Jan. 20, 2017

(65) Prior Publication Data

US 2018/0211969 A1    Jul. 26, 2018

(51) Int. Cl.
| | |
|---|---|
| H01L 27/11582 | (2017.01) |
| H01L 21/768 | (2006.01) |
| H01L 23/528 | (2006.01) |
| H01L 23/522 | (2006.01) |
| H01L 21/28 | (2006.01) |

(52) U.S. Cl.
CPC .. H01L 27/11582 (2013.01); H01L 21/28282 (2013.01); H01L 21/76802 (2013.01); H01L 21/76877 (2013.01)

(58) Field of Classification Search
CPC ......... H01L 27/11582; H01L 21/76802; H01L 21/76877; H01L 23/5226; H01L 23/528
See application file for complete search history.

(56) References Cited

U.S. PATENT DOCUMENTS

| | | | | |
|---|---|---|---|---|
| 9,111,617 | B2* | 8/2015 | Shim | ............... G11C 16/0466 |
| 9,147,468 | B1* | 9/2015 | Lue | ................... G11C 11/5671 |
| 9,177,966 | B1* | 11/2015 | Rabkin | ............. H01L 27/11582 |
| 9,401,371 | B1* | 7/2016 | Lee | ................... H01L 27/11582 |
| 2012/0001249 | A1* | 1/2012 | Alsmeier | .......... H01L 27/11551 |
| | | | | 257/319 |
| 2014/0061776 | A1 | 3/2014 | Kwon et al. | |

(Continued)

OTHER PUBLICATIONS

Choi et al., "Comprehensive evaluation of early retention (fast charge loss within a few seconds) characteristics in tube-type 3-D NAND flash memory," 2016 IEEE Symposium on VLSI Technology, Honolulu, HI, Jun. 14-16, 2016, pp. 1-2.

(Continued)

*Primary Examiner* — Christine A Enad
(74) *Attorney, Agent, or Firm* — Haynes Beffel & Wolfeld LLP

(57) ABSTRACT

A memory device includes a plurality of stacks of conductive strips alternating with insulating strips, the insulating strips having first and second sides, and the conductive strips having first sidewalls recessed relative to the first sides of the insulating strips which define first recessed regions in sides of the stacks. Vertical channel pillars are disposed between the stacks, the vertical channel pillars having first and second channel films disposed on adjacent stacks and a dielectric material between and contacting the first and second channel films. Data storage structures at cross points of the vertical channel pillars and the conductive strips include tunneling layers in contact with the vertical channel pillars, discrete charge trapping elements in the first recessed regions in contact with the tunneling layers and blocking layers between the discrete charge trapping elements and the first sidewalls of the conductive strips.

25 Claims, 12 Drawing Sheets

(56) References Cited

U.S. PATENT DOCUMENTS

| | | | |
|---|---|---|---|
| 2015/0179661 A1* | 6/2015 | Huo | H01L 21/764 257/57 |
| 2016/0071861 A1* | 3/2016 | Serov | H01L 27/11556 365/185.19 |
| 2016/0204117 A1* | 7/2016 | Liu | H01L 29/66825 257/324 |
| 2016/0260733 A1 | 9/2016 | Lue | |
| 2017/0243879 A1* | 8/2017 | Yu | H01L 21/0214 |
| 2018/0182776 A1* | 6/2018 | Kim | H01L 27/11582 |

OTHER PUBLICATIONS

Jang et al., "Vertical cell array using TCAT(Terabit Cell Array Transistor) technology for ultra high density NAND flash memory," 2009 Symposium on VLSI Technology, Honolulu, HI, Jun. 16-18, 2009, pp. 192-193.

Jung et al, "Three Dimensionally Stacked NAND Flash Memory Technology Using Stacking Single Crystal Si Layers on ILD and TANOS Structure for Beyond 30nm Node," International Electron Devices Meeting, 2006. IEDM '06, Dec. 11-13, 2006, pp. 1-4.

Lai et al., "A Multi-Layer Stackable Thin-Film Transistor (TFT) NAND-Type Flash Memory," International Electron Devices Meeting, 2006. IEDM '06, Dec. 11-13, 2006, pp. 1-4.

\* cited by examiner

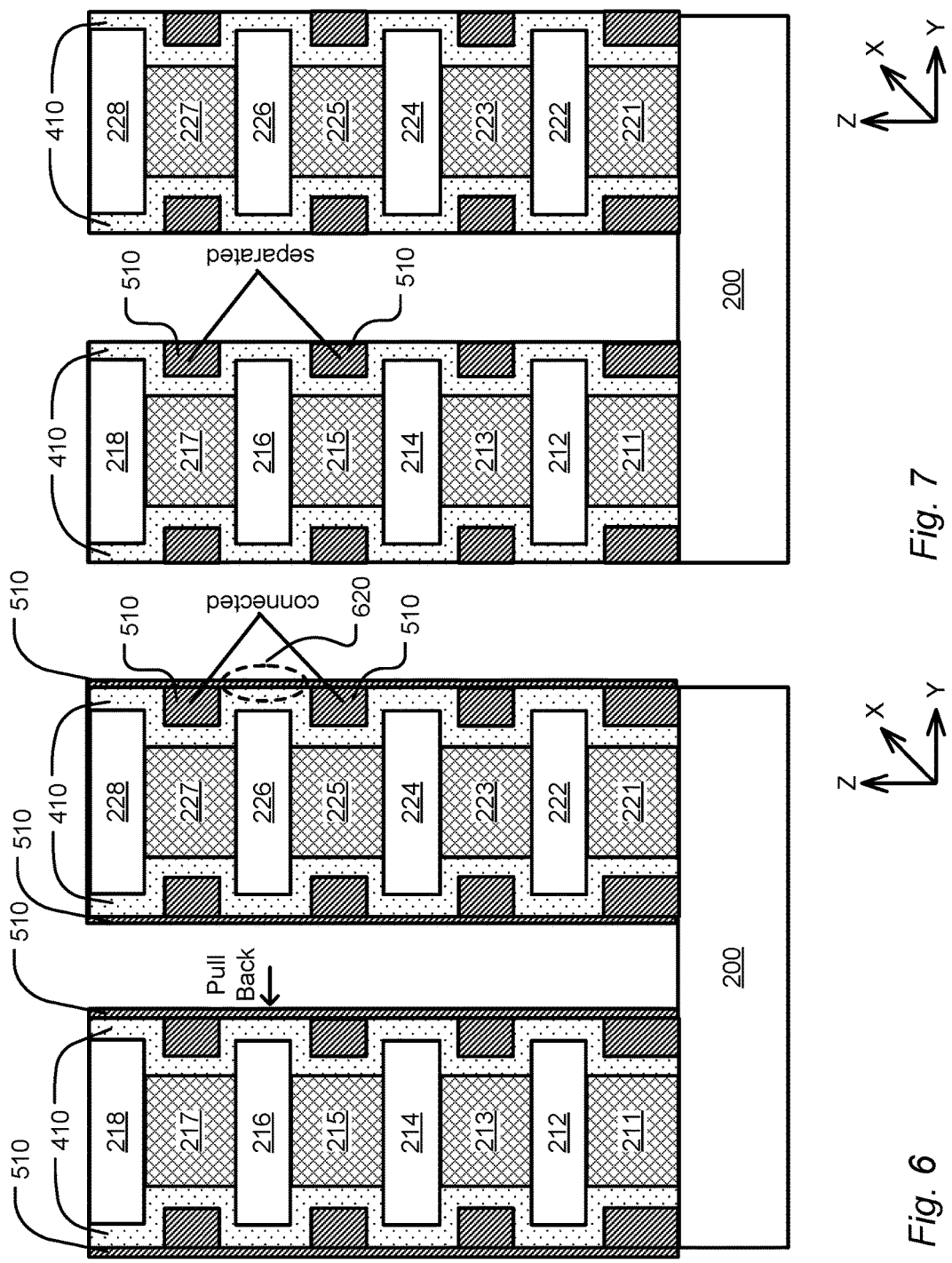

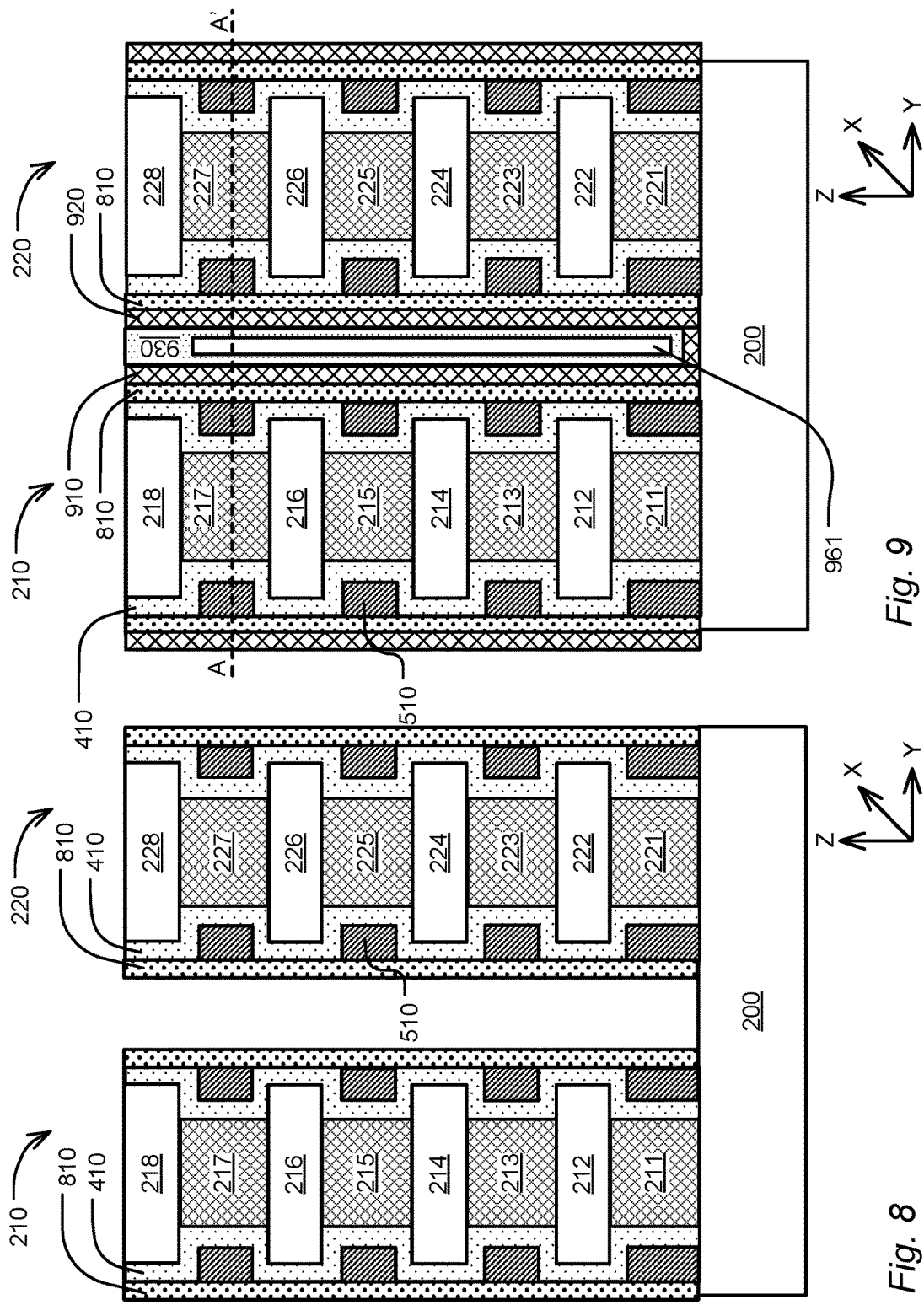

DISCRETE CHARGE TRAPPING ELEMENTS FOR 3D NAND ARCHITECTURE

BACKGROUND OF THE INVENTION

Field of the Invention

The present invention relates to high density memory devices, and particularly to memory devices in which multiple planes of memory cells are arranged to provide a three-dimensional 3D array.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin-film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Three dimensionally stacked NAND flash memory with a charge trap layer (SiN) has a lateral charge migration issue, where lateral charge migration is expected to cause problems because the charge trap layer is shared between word lines. Lateral charge migration can cause unwanted results in a negative shift of the threshold voltage (VT) and a positive shift of the string read current immediately after programming. See Choi et al., "Comprehensive evaluation of early retention (fast charge loss within a few seconds) characteristics in tube-type 3-D NAND Flash Memory," IEEE 2016 Symposium on VLSI Technology Digest of Technical Papers.

It is desirable to provide a structure for three-dimensional integrated circuit memory including a charge trap layer (SiN) without lateral charge migration issues.

SUMMARY

A vertical channel memory is described, which can be configured as a 3D NAND flash memory device. The memory device can include discrete charge trapping elements in recessed regions on opposing sidewalls of conductive strips in stacks of conductive strips. In embodiments, the discrete charge trapping elements are dielectric charge trapping elements.

In an example described herein, the memory device comprises a plurality of stacks of conductive strips alternating with insulating strips, where the insulating strips in the stacks have first and second sides, and the conductive strips in the stacks have first sidewalls recessed relative to the first sides of the insulating strips which define first recessed regions in sides of the stacks.

The memory device comprises vertical channel pillars disposed between the stacks, where the vertical channel pillars have first and second channel films disposed on adjacent stacks in the plurality of stacks and a dielectric material between and contacting the first and second channel films.

The memory device comprises data storage structures at cross points of the vertical channel pillars between the stacks and the conductive strips in the stacks. The data storage structures can include tunneling layers in contact with the vertical channel pillars, discrete charge trapping elements in contact with the tunneling layers, and blocking layers between the discrete charge trapping elements and the first sidewalls of the conductive strips. The discrete charge trapping elements are disposed in the first recessed regions on the first sidewalls of the conductive strips. In embodiments, the discrete charge trapping elements disposed in the first recessed regions are dielectric charge trapping elements.

The conductive strips in the stacks can have second sidewalls opposite the first sidewalls recessed relative to the second sides of the insulating strips which define second recessed regions on the second sidewalls of the conductive strips. The data storage structures can include discrete charge trapping elements disposed in the second recessed regions in contact with the tunneling layers, and blocking layers between the discrete charge trapping elements in the second recessed regions and the second sidewalls of the conductive strips. In embodiments, the discrete charge trapping elements disposed in the second recessed regions are dielectric charge trapping elements.

As described herein, discrete charge trapping elements are disposed in the first and second recessed regions on the opposing first and second sidewalls of conductive strips in a plurality of stacks of conductive strips, where the discrete charge trapping elements disposed in the first recessed regions on the first sidewall of conductive strips in a particular stack are separated from the discrete charge trapping elements disposed in the second recessed regions on the second sidewall of conductive strips in an adjacent stack by a vertical channel pillar disposed between the particular stack and the adjacent stack, the vertical channel pillar having first and second channel films disposed on adjacent stacks in the plurality of stacks and a dielectric material between and contacting the first and second channel films. At layers of conductive strips in the stacks in a direction along the conductive strips (e.g. X-direction, FIG. 10), the discrete charge trapping elements and the vertical channel pillars are isolated by insulating structures (e.g. 1001-1009, FIG. 10) through the layers of conductive strips.

In one embodiment, the conductive strips in the plurality of stacks of conductive strips can include a semiconductor material such as polysilicon. In another embodiment, the conductive strips in the plurality of stacks of conductive strips can include a metal material such as tungsten.

The vertical channel pillars can be arranged so that a first row of the vertical channel pillars disposed on the first sidewalls of a particular stack of conductive strips is offset in a row direction from a second row of the vertical channel pillars disposed on the second sidewalls of the particular stack of conductive strips Methods for manufacturing memory devices as described herein are also provided. In one embodiment, a method for manufacturing includes forming stacks of conductive strips including a semiconductor material such as polysilicon. In another embodiment, a method for manufacturing includes forming stacks of conductive strips including a metal material such as tungsten.

Other aspects and advantages of the present invention can be seen on review of the drawings, the detailed description and the claims, which follow.

BRIEF DESCRIPTION OF THE DRAWINGS

FIGS. 2 through 10 illustrate an example process flow for a memory architecture including data storage structures including discrete charge trapping elements.

DETAILED DESCRIPTION

Figure 1:
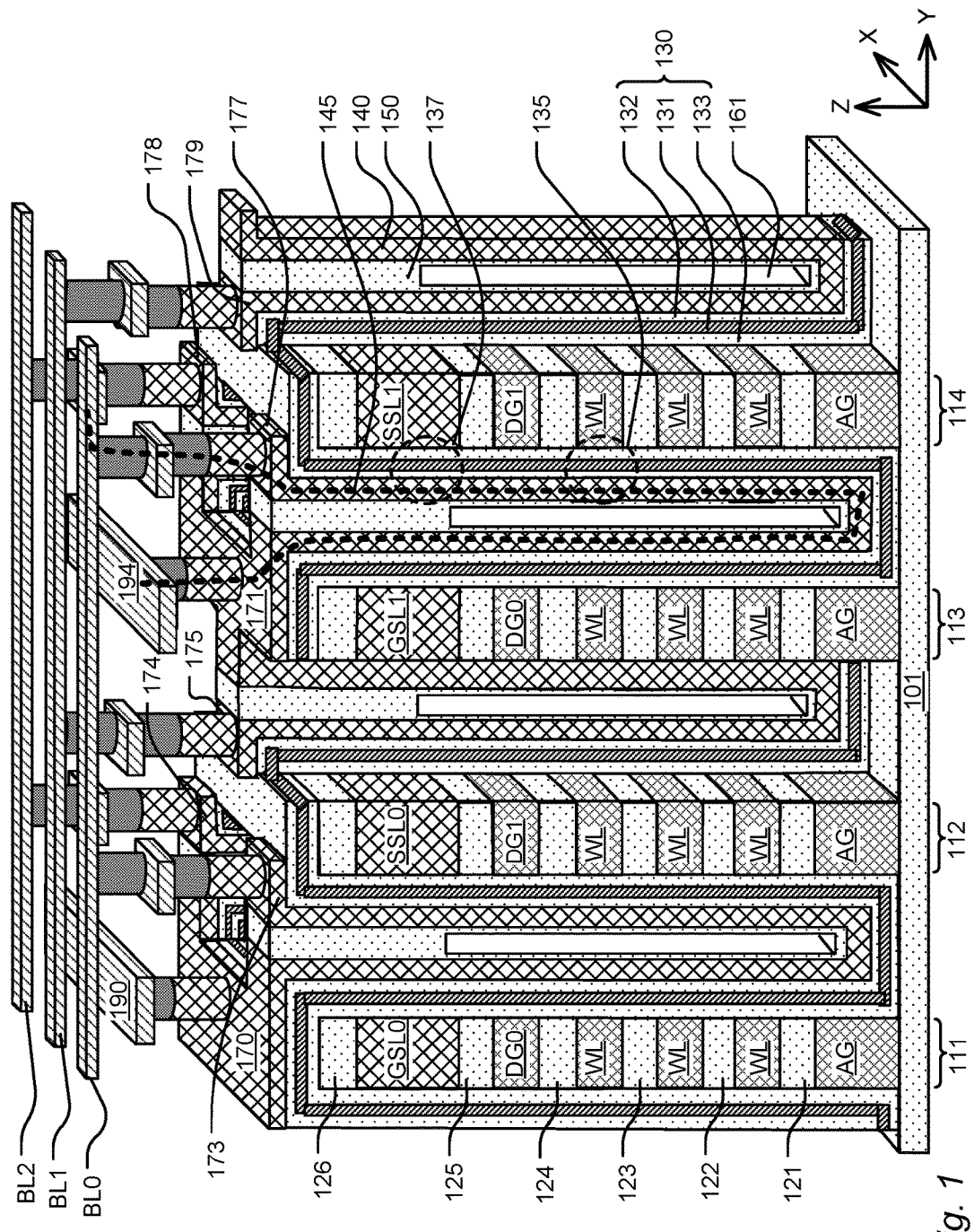
FIG. 1 is a simplified perspective diagram of a 3D SGVC NAND memory device.

A detailed description of embodiments of the present invention is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 is a simplified perspective diagram of a 3D NAND flash memory device, according to a 3D vertical channel technology having a structure as described in co-pending U.S. patent application Ser. No. 14/637,204, filed on 3 Mar. 2015, which application is incorporated by reference as if fully set forth herein.

The memory device includes a plurality of stacks of conductive strips. The plurality of stacks of conductive strips includes even stacks (e.g. 112 and 114) and odd stacks (e.g. 111 and 113). The even stacks of conductive strips 112 and 114 include upper strips configured as string select lines (e.g. SSL0 and SSL1), and intermediate strips configured as word lines (e.g. WL). An even stack (e.g. 112) can also include a dummy strip (e.g. DG1) between the upper strip (e.g. SSL0) and the intermediate strips (e.g. WLs) in the even stack, which is not configured to form a memory cell for data storage.

The odd stacks of conductive strips (e.g. 111 and 113) in the memory device can include upper strips configured as ground select lines (e.g. GSL0 and GSL1). An odd stack (e.g. 111) can also include a dummy strip (e.g. DG0) between the upper strip (e.g. GSL0) and the intermediate strips (e.g. WLs) in the odd stack, which is not configured to form a memory cell for data storage. At least one of the even stacks and odd stacks of conductive strips can include bottom strips configured as assist gates (AG) disposed below the intermediate strips.

The stacks of conductive strips can be disposed on an insulating layer 101 which can comprise a silicon oxide or other dielectric on a semiconductor substrate. The stacks 111-114 include layers of insulating material 121, 122, 123, 124, 125 and 126, separating the conductive strips in the stacks from one another. The conductive material can be a polysilicon material or other material selected for compatibility with the data storage structure. The layers of insulating material can comprise silicon dioxide deposited in a variety of ways as known in the art. Also, the layers of insulating material can comprise other insulating materials, and combinations of insulating materials. In this example, all of the insulating layers consist of the same material. In other examples, different materials can be used in different layers as suits a particular design goal.

Data storage structures 130 are disposed on the sidewalls of the corresponding even and odd stacks of conductive strips. Semiconductor films 140 are disposed on the data storage structures 130 on the sidewalls of the corresponding even and odd stacks. An insulating material 150 such as silicon dioxide is filled between stacks on the inside surfaces of the semiconductor films 140. In one embodiment, the insulating material 150 can completely fill the regions between the stacks. In another embodiment, the insulating material 150 can leave an air gap 161 at least in regions adjacent the intermediate strips of conductive strips (e.g. WL).

Semiconductor films 140 include portions 170 and 171 which overlie the odd stacks 111 and 113 respectively. Portions 173, 174 and 175 of the semiconductor films 140 overlie the even stack 112. Portions 177, 178 and 179 of the semiconductor films 140 overlie the even stack 114. The portions 170 and 171 connect the semiconductor films having outside surfaces disposed on the data storage structures on the sidewalls of the odd stacks 111 and 113 on the common source side of the NAND strings together and provide landing areas for interlayer connectors for connection to a common source line. The portions 173, 174, 175, 177, 178 and 179 are separated and provide landing areas for interlayer connectors making independent connections to bit lines.

A patterned conductor layer or layers overlie the stacks. A first interlayer connector connects a first conductor (e.g. bit lines BL0, BL1, BL2) to a top surface of a first semiconductor film on the data storage structures on the sidewalls of an even stack in the plurality of stacks (e.g. 112, 114). A second interlayer connector connects a second conductor (e.g. source reference conductor lines 190 and 194) to a top surface of a second semiconductor film on the data storage structures on the sidewalls of a corresponding odd stack in the plurality of stacks (e.g. 111 and 113).

Data storage structures 130 can include a tunneling layer 132, a charge storage layer 131, and a blocking layer 133. The data storage structures 130 can include for example dielectric charge trapping materials known as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

Semiconductor films 140 have outside surfaces and inside surfaces. The outside surfaces are disposed on the data storage structures on the sidewalls of the corresponding even and odd stacks in the plurality of stacks forming a 3D array of memory cells (e.g. 135). The semiconductor films 140 are connected to form a current path 145 from an upper end to a lower end of the semiconductor film on the corresponding even stacks, and from a lower end to an upper end of the semiconductor film on the corresponding odd stacks.

The even stacks (e.g. 114) in the plurality of stacks include string select switches (e.g. 137) coupled to first string select lines (e.g. SSL1). The string select switches can include the data storage structures 130 on the sidewalls of the even stacks (e.g. 114) in the plurality of stacks. The data storage structures 130 can include charge trapping nitride material such as ONO, as described above.

FIGS. 2 through 10 illustrate an example process flow for a memory architecture including data storage structures including discrete charge trapping elements. To form the structure shown in FIG. 2, a plurality of layers of a conductive material, such as doped polysilicon, or other material suitable for use as word lines, separated by layers of insulating material are disposed over a substrate (e.g. 200).

Figures 2, 3:
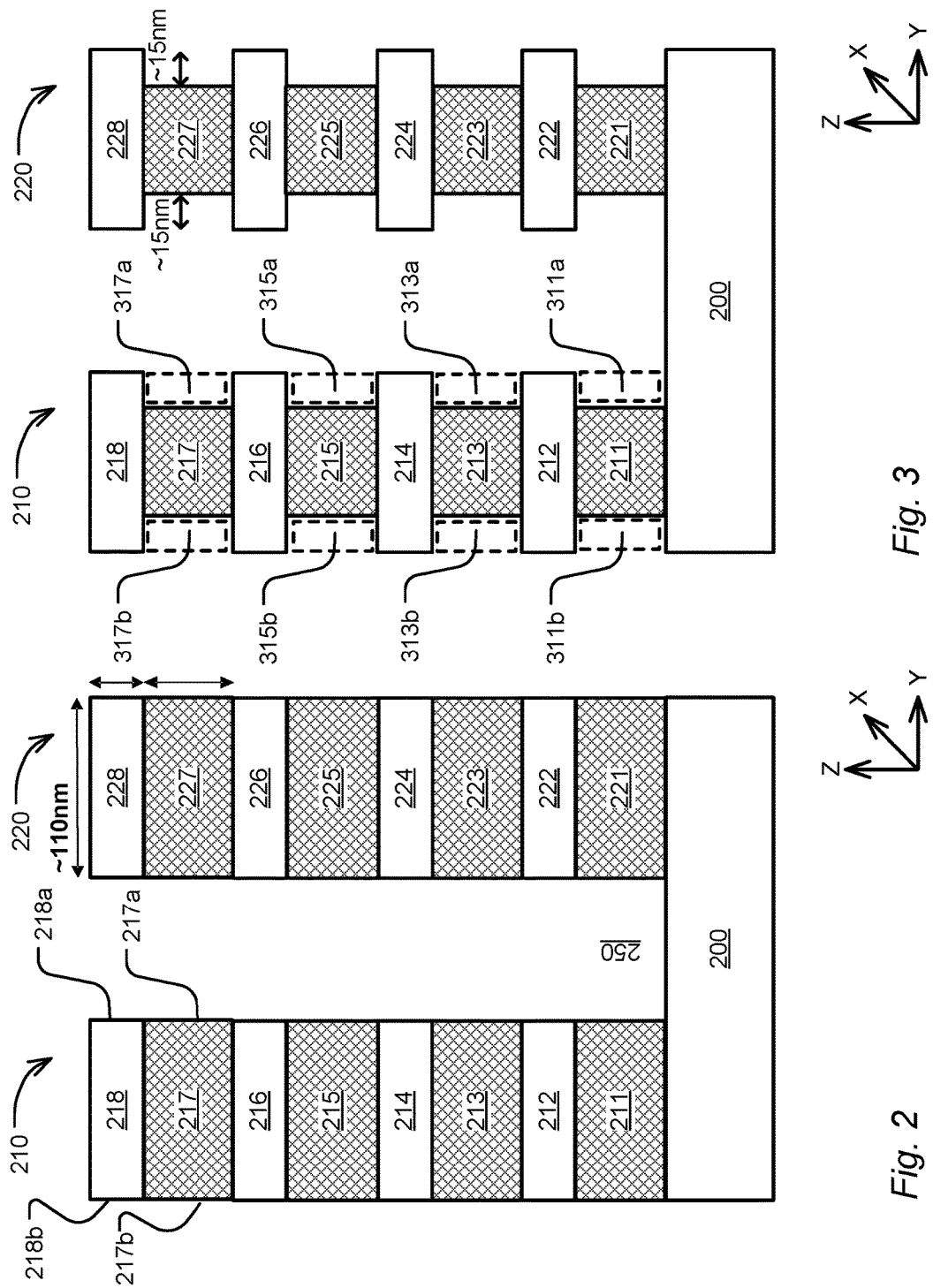

FIG. 2 illustrates a stage of the process flow after etching the plurality of layers of the conductive material, to define a plurality of stacks of conductive strips, including stacks 210 and 220, alternating with insulating strips. For instance, stack 210 includes conductive strips 211, 213, 215 and 217 alternating with insulating strips 212, 214, 216 and 218, and stack 220 includes conductive strips 221, 223, 225 and 227 alternating with insulating strips 222, 224, 226 and 228. The conductive strips are disposed in a direction X orthogonal to a YZ plane defined by a Y direction and a Z direction. Each stack can include a bottom plane (GSL) of conductive strips, a plurality of intermediate planes (WLs) of conductive strips, and a top plane of conductive strips (SSLs), as shown in FIG. 1. Although as shown in the example of FIG. 2, a trench (e.g. 250) separating two adjacent stacks (e.g. 210, 220) is flush with a top surface of a substrate (e.g. 200), in embodiments, the trench can extend into the substrate.

As shown in the example of FIG. 2, a stack (e.g. 220) or an insulating strip (e.g. 228) can have a width of about 110 nm (nanometers), an insulating strip (e.g. 228) can have a thickness of about 20 nm, and a conductive strip (e.g. 227) can have a thickness of about 50 nm.

The insulating strips in the stacks have first and second sides. For instance, an insulating strip 218 has a first side 218*a* and a second side 218*b*. The conductive strips in the stacks have first and second sidewalls. For instance, a conductive strip 217 has a first sidewall 217*a* and a second sidewall 217*b*.

FIG. 3 illustrates a stage of the process flow after recessing the first sidewalls of the conductive strips relative to the first sides of the insulating strips to define first recessed regions in sides of the stacks. For instance, the first sidewall 217*a* of the conductive strip 217 is recessed relative to the first side 218*a* of the insulating strip 218 to define a first recessed region 317*a* in a side of the stack 210. Similarly, first recessed regions 311*a*, 313*a* and 315*a* are formed on respective first sidewalls of the conductive strips 211, 213 and 215 in a first side of the stack 210. Second recessed regions 311*b*, 313*b*, 315*a* and 317*b* are formed on respective second sidewalls of the conductive strips 211, 213 and 215 in a second side of the stack 210 opposite the first side.

The conductive material in the conductive strips can be recessed by using isotropic etching technology. As shown in the example of FIG. 3, a conductive strip (e.g. 227) can be recessed by about 15 nm (nanometers) on its first sidewall and/or its second sidewall. A polysilicon lateral recess process can be performed by adding NF3, CH3F, CH2F2 with suitable gas and power in the polysilicon etcher tool. An example recipe for the polysilicon lateral recess process can include 180 mT/500 T/TCCT 1.0/100V (DC25%, Freq 200)/gas equal/400NF3/10CH3F/30CH2F2/60-60-56-56/20-He/20.

FIG. 4-8 illustrate forming a memory layer on sidewalls of conductive strips in the plurality of stacks. The memory layer contacts sidewalls of the conductive strips in the plurality of stacks. The memory layer can comprise a multilayer data storage structure, including tunneling layers, charge trapping material, and blocking layers, examples of which are discussed above. In one preferred example, the memory layer is implemented as illustrated below with reference to FIGS. 4-8.

Figure 4:
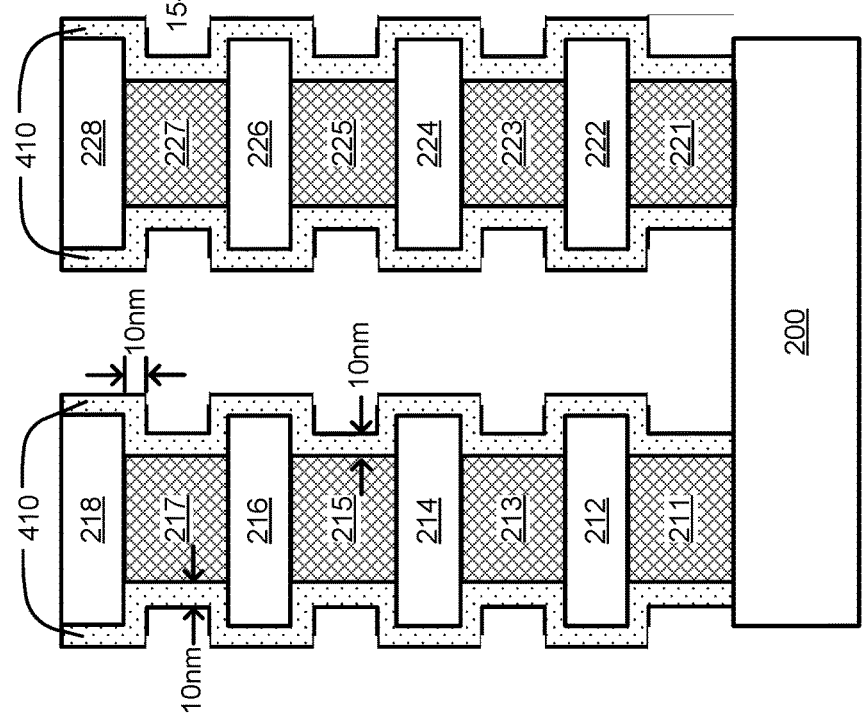

FIG. 4 illustrates a stage of the process flow after depositing blocking layers (e.g. 410) over the first sidewalls (e.g. 217*a*, FIG. 2) of the conductive strips (e.g. 217, FIG. 2) in the first recessed regions (e.g. 317*a*, FIG. 3). The blocking layers (e.g. 410) can be deposited over the second sidewalls (e.g. 217*b*, FIG. 2) of the conductive strips (e.g. 217, FIG. 2) in the second recessed regions (e.g. 317*b*, FIG. 3). The blocking layers (e.g. 410) can be deposited over the first sides (e.g. 218*a*, FIG. 2) and/or the second sides (e.g. 218*b*, FIG. 2) of the insulating strips (e.g. 218, FIG. 2). For instance, the blocking layers can have a thickness of about 10 nm.

The blocking layers can include a combination of multilayer thin films to optimize erase saturation. For instance, the combination of multilayer thin films can include layers of materials such as High-κ (high dielectric constant as compared to silicon dioxide), capped SiN, ONO (Oxide-Nitride-Oxide, e.g. O4, N3, O3) for double trapping BE-SONOS (Band-gap Engineered Silicon-Oxide-Nitride-Oxide-Silicon). The blocking layers are further described in co-pending U.S. patent application Ser. No. 14/637,204 , filed on 3 Mar. 2015, which application is incorporated by reference as if fully set forth herein.

Figure 5:
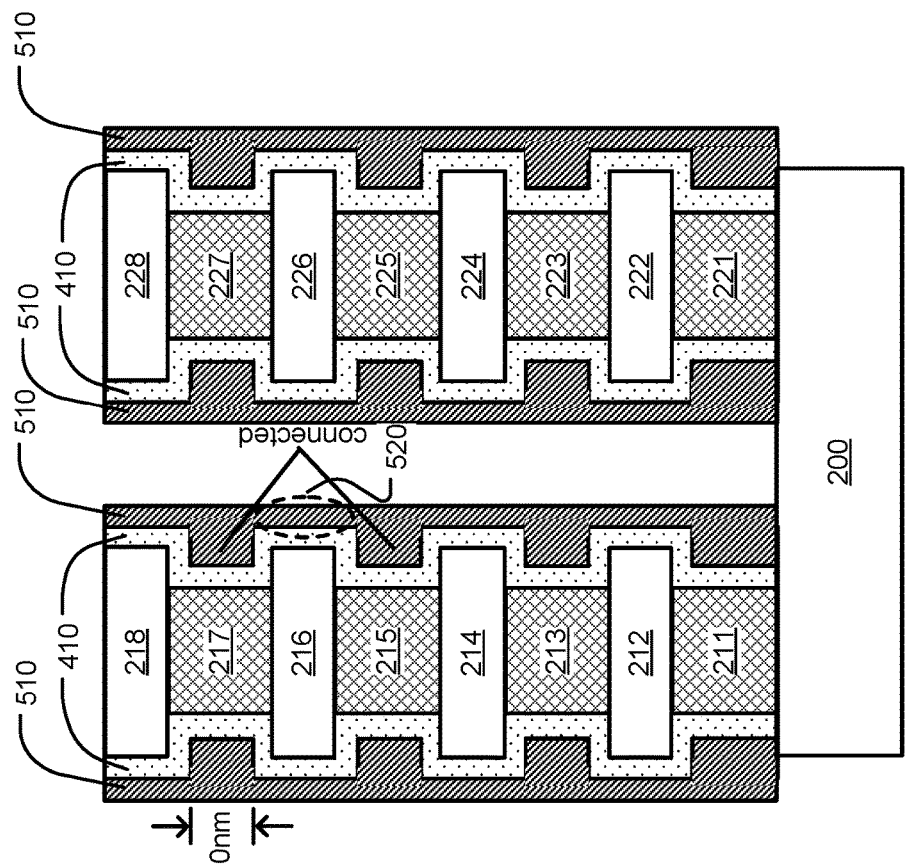

FIG. 5 illustrates a stage of the process flow after depositing charge trapping material (e.g. 510) over the blocking layers (e.g. 410) in the first recessed regions (e.g. 311*a*, 313*a*, 315*a*, 317*a*, FIG. 3). In embodiments, the charge trapping material is dielectric charge trapping material. The charge trapping material can be deposited over the blocking layers (e.g. 410) in the second recessed regions (e.g. 311*b*, 313*b*, 315*b*, 317*b*, FIG. 3). The charge trapping material can be deposited over the blocking layers over the first sides (e.g. 218*a*) and/or the second sides (e.g. 218*b*) of the insulating strips (e.g. 218). The charge trapping material can include SiN (silicon nitride). The charge trapping material can have a thickness of about 15 nm to 30 nm in the first recessed regions and/or the second recessed regions. Although the charge trapping material typically includes SiN, the charge trapping material can include SiON, HfO2, Al2O3, etc.

As shown in the example of FIG. 5, the charge trapping material (e.g. 510) as deposited in the first recessed regions (e.g. 311*a*, 313*a*, 315*a*, 317*a*, FIG. 3) in a first side of a stack (e.g. 210) may not be separated between adjacent first recessed regions, because the charge trapping material deposited on sides of the insulating strips (e.g. 520) may connect the charge trapping material in adjacent recessed regions. Similarly, the charge trapping material (e.g. 510) as deposited in the second recessed regions (e.g. 311*b*, 313*b*, 315*b*, 317*b*, FIG. 3) in a second side of a stack (e.g. 210) may not be separated between adjacent second recessed regions.

Figure 10:
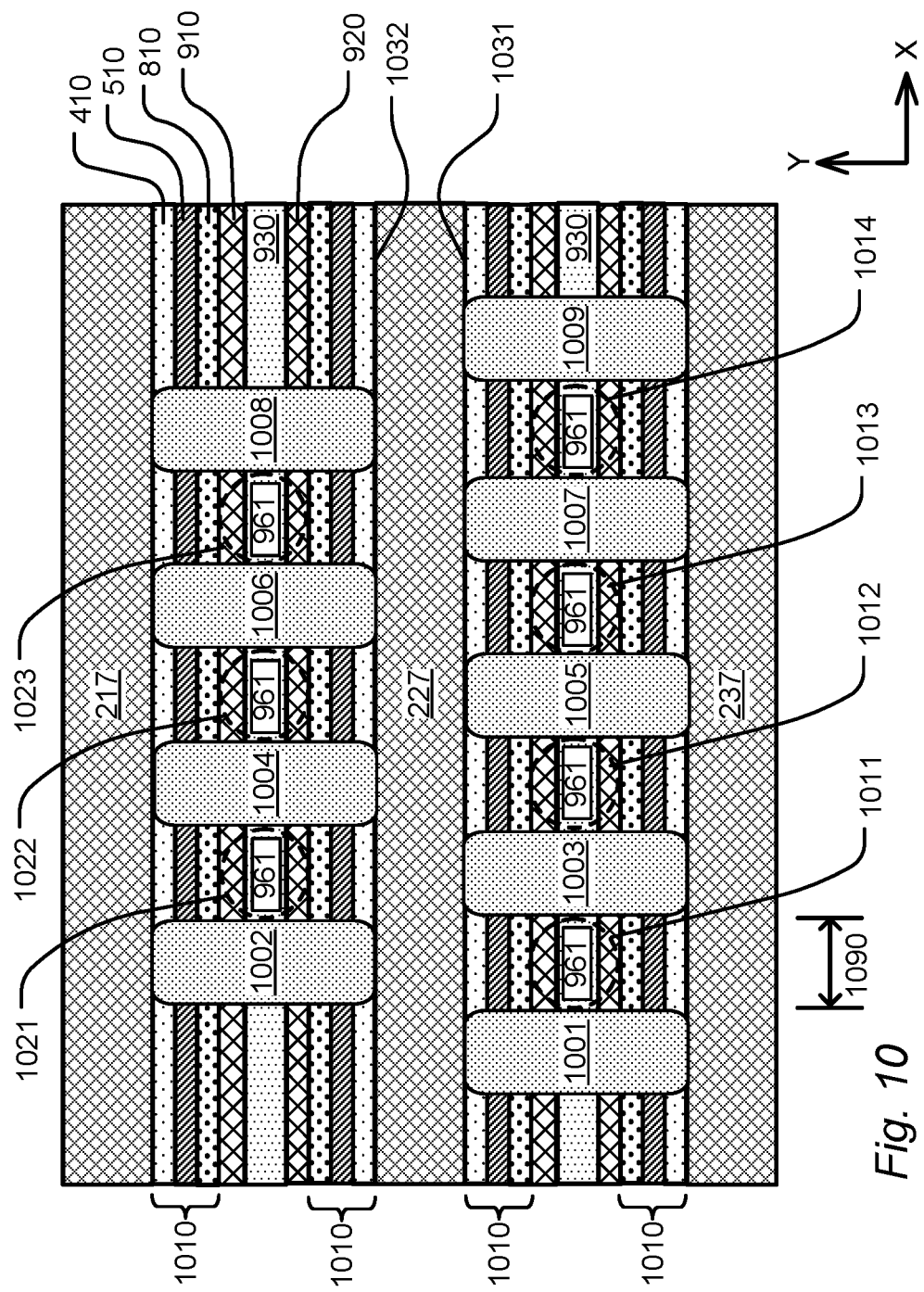

FIGS. 6, 7 and 10 illustrate methods to separate the charge trapping material into discrete charge trapping elements. In embodiments, the discrete charge trapping elements are dielectric charge trapping elements. FIGS. 6 and 7 illustrate methods to separate the charge trapping material between adjacent first recessed regions, and between adjacent second recessed regions, in a vertical direction (e.g. the Z-direction). FIG. 10 illustrates methods to separate the charge trapping material in the X-direction. In the Y-direction, the charge trapping material (e.g. 510, FIG. 10) is separated by the vertical channel pillars (e.g. 910, 920 and 930, FIG. 10)

on one side, and by the conductive strips (e.g. 217, FIG. 10) on an opposite side. The Z-direction is orthogonal to a plane defined by the X-direction and the Y-direction, and the X-direction is orthogonal to the Y-direction.

FIG. 6 illustrates a stage of the process flow after an isotropic etching process is applied to the charge trapping material (e.g. 510), to pull back the charge trapping material towards the conductive strips over whose sidewalls the blocking layers (e.g. 410, FIG. 4) and the charge trapping material (e.g. 510, FIG. 5) are deposited. The isotropic etching process can remove most of the charge trapping material deposited over the blocking layers over the first sides and second sides of the insulating strips, while keeping the charge trapping material in the first recessed regions and the second recessed regions. But a small amount of the charge trapping material (e.g. 620) may still remain over the sides of the insulating strips, connecting the charge trapping material in adjacent recessed regions.

FIG. 7 illustrates a stage of the process flow after an oxidation process is applied to oxidize the charge trapping material (e.g. 510) on sides of the stacks, so that the charge trapping material (e.g. SiN) deposited on sides of the insulating strips can be oxidized into an oxide layer (e.g. SiON) on sides of the stacks, while keeping the charge trapping material (e.g. SiN) in the first recessed regions and the second recessed regions. The oxide layer thus formed can serve as part of the tunneling layers which are described in connection to FIG. 8. Consequently, the charge trapping material in adjacent first recessed regions on a first side of the stack are separated from each other in a vertical direction (e.g. Z-direction), as opposed to being connected via the charge trapping material on sides of the insulating strips between adjacent first recessed regions. Similarly the charge trapping material in adjacent second recessed regions on a second side of the stack are separated from each other in the vertical direction, as opposed to being connected via the charge trapping material on sides of the insulating strips between adjacent second recessed regions.

FIG. 8 illustrates a stage of the process flow after depositing tunneling layers (e.g. 810) over the charge trapping material in the first recessed regions on the first side of the stacks and in the second recessed regions on the second side of the stacks. The tunneling layers can include a bandgap engineered composite tunneling dielectric layer comprising a layer of silicon dioxide less than 2 nm thick. In one embodiment, the composite tunneling dielectric layer consists of an ultrathin silicon oxide layer $O_1$ (e.g. <=15 Å), an ultrathin silicon nitride layer $N_1$ (e.g. <=30 Å) and an ultrathin silicon oxide layer $O_2$ (e.g. <=35 Å), which results in an increase in the valence band energy level of about 2.6 eV at an offset 15 Å or less from the interface with the semiconductor body. The $O_2$ layer separates the $N_1$ layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the $O_2$ layer does not significantly interfere with the electric field assisted hole tunneling, while improving the ability of the engineered tunneling dielectric to block leakage during low fields. These layers can be conformally deposited using for example LPCVD.

FIG. 9 illustrates a stage of the process flow after forming vertical channel pillars disposed between the stacks, such as between an odd stack 210 and an even stack 220. The vertical channel pillars are formed by forming first and second channel films (e.g. 910 and 920) on the data storage structures on sidewalls of adjacent stacks, and depositing a dielectric material (e.g. 930) between the first and second channel films (e.g. 910 and 920), where the dielectric material contacts the first and second channel films (e.g. 910 and 920) on the sidewalls of the adjacent stacks. Consequently the vertical channel pillars have first and second channel films disposed on the data storage structures on sidewalls of adjacent stacks in the plurality of stacks and a dielectric material between and contacting the first and second channel films. In one embodiment, the dielectric material (e.g. 930) can completely fill the regions between the stacks. In another embodiment, the dielectric material (e.g. 930) can leave an air gap 961 at least in regions adjacent the intermediate strips of conductive strips in the stacks (e.g. 211, 213, 215, 217, 221, 223, 225 and 227).

The deposition techniques applied to form layers of materials in the data storage structures and channel films can be carried out by LPCVD processes, which provide excellent film quality and conformality required. The data storage structures can include blocking layers (e.g. 410), charge trapping material (e.g. 510), and tunneling layers (e.g. 810). On the other hand, tools such as atomic layer deposition ALD tools can be utilized for these films.

An even/odd level decoder (e.g. 1950, FIG. 19) can be coupled to a plurality of even/odd word lines such as the conductive strips (e.g. 211, 213, 215, 217, 221, 223, 225, and 227) in the odd stack 210 and the even stack 220 that can act as word lines.

FIG. 10 illustrates a stage of the process flow after etching to isolate the data storage structures (e.g. 1010) along the conductive strips (e.g. 217, 227, 237), to form discrete charge trapping elements (e.g. 510), and to isolate the first and second channel films (e.g. 910 and 920) and the dielectric material (e.g. 930) between the first and second channel films along the conductive strips, to form vertical channel pillars between the stacks. The discrete charge trapping elements (e.g. 510) are in contact with the tunneling layers (e.g. 810) and the blocking layers (e.g. 410) between the discrete charge trapping elements and the first sidewalls of the conductive strips (e.g. 217). The data storage structures (e.g. 1010) can include the blocking layers (e.g. 410), the discrete charge trapping elements (e.g. 510), and the tunneling layers (e.g. 810). The vertical channel pillars can include first and second channel films (e.g. 910 and 920) and a dielectric material (e.g. 930) between the first and second channel films.

FIG. 10 is a cross-section taken in the XY plane along a line A-A' which is marked in FIG. 9. The cross-section illustrates a layout view with a dielectric material (e.g. 930) between first and second channel films (e.g. 910 and 920), and an insulating structure (e.g. insulators 1001-1009) isolating the data storage structures (e.g. 1010) and the vertical channel pillars (e.g. 910, 930, 920) along a conductive strip (e.g. 227). In one embodiment, the dielectric material (e.g. 930) can completely fill the regions between the stacks. In another embodiment, the dielectric material (e.g. 930) can leave an air gap 961 at least in regions adjacent the intermediate strips of conductive strips in the stacks (e.g. 211, 213, 215, 217, 221, 223, 225 and 227).

In the layout view, the conductive strips 217, 227 and 237 are illustrated. Each of the conductive strips in the cross-section is disposed in a separate stack of conductive strips. Although one conductive strip is shown for a respective stack, each stack can include multiple conductive strips disposed vertically and separated by insulating strips. Vertical channel pillars (e.g. 910, 930 and 920) are disposed between the conductive strips (e.g. 217, 227 and 237).

In this embodiment, the vertical channel pillars are arranged so that a first row of the vertical channel pillars (e.g. 1011-1014) disposed on the first sidewalls (e.g. 1031) of a particular stack of conductive strips (e.g. 227) is offset (e.g. 1090) in a row direction (e.g. the X direction) from a second row of the vertical channel pillars (e.g. 1021-1023) disposed on the second sidewalls (e.g. 1032) of the particular stack of conductive strips. This results in a twisted layout allowing a tighter pitch for overlying bit lines.

The example process flow illustrated in FIGS. 2 through 10 can result in an SGVC (single gate vertical channel) architecture including data storage structures including discrete charge trapping elements. The data storage structures are disposed at cross points of the vertical channel pillars between the stacks and the conductive strips in the stacks. The data storage structures include tunneling layers in contact with the vertical channel pillars, discrete charge trapping elements in contact with the tunneling layers and blocking layers between the discrete charge trapping elements and the first sidewalls of the conductive strips, where the discrete charge trapping elements are disposed in the first recessed regions on the first sidewalls of the conductive strips. The data storage structures can include blocking layers between the discrete charge trapping elements and the second sidewalls of the conductive strips, where the discrete charge trapping elements are disposed in the second recessed regions on the second sidewalls of the conductive strips.

Figure 11:
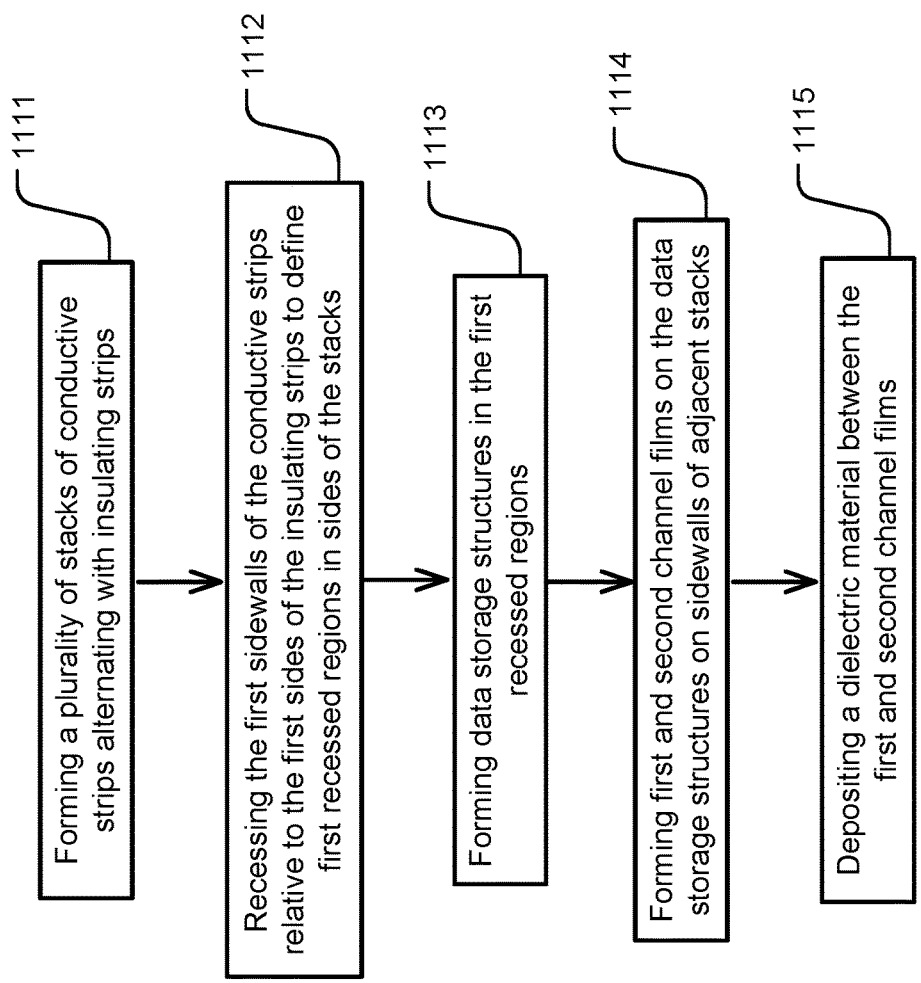
FIG. 11 is an example flow chart illustrating a manufacturing method for a memory architecture including data storage structures including discrete charge trapping elements.

FIG. 11 is a flow chart illustrating a manufacturing method for a memory architecture including vertical channel pillars disposed between stacks in a plurality of stacks of conductive strips, where the vertical channel pillars have first and second channel films disposed on adjacent stacks in the plurality of stacks and a dielectric material between and contacting the first and second channel films, and data storage structures including discrete charge trapping elements at cross points of the vertical channel pillars between the stacks and the conductive strips in the stacks. The method includes forming a plurality of stacks of conductive strips alternating with insulating strips, where the insulating strips in the stacks have first and second sides, and the conductive strips in the stacks have first sidewalls, as described in connection to FIG. 2 (Step 1111). The method includes recessing the first sidewalls of the conductive strips relative to the first sides of the insulating strips to define first recessed regions in sides of the stacks, as described in connection to FIG. 3 (Step 1112).

The method includes forming data storage structures in the first recessed regions (Step 1113). This step can include depositing blocking layers over the first sidewalls of the conductive strips in the first recessed regions as described in connection to FIG. 4, depositing charge trapping material over the blocking layers in the first recessed regions as described in connection to FIGS. 5-7, and depositing tunneling layers over the charge trapping material in the first recessed regions as described in connection to FIG. 8.

Furthermore, depositing the blocking layers can include depositing the blocking layers over the first sides of the insulating strips, and depositing the charge trapping material can include depositing the charge trapping material over the blocking layers over the first sides of the insulating strips, and separating the charge trapping material between adjacent first recessed regions. Separating the charge trapping material can include removing the charge trapping material over the blocking layers over the first sides of the insulating strips, while keeping the charge trapping material in the first recessed regions.

The method includes forming vertical channel pillars by forming first and second channel films on the data storage structures on sidewalls of adjacent stacks (Step 1114), and depositing a dielectric material between the first and second channel films, the dielectric material contacting the first and second channel films on the sidewalls of the adjacent stacks (Step 1115).

The method can further include etching to isolate the data storage structures along the conductive strips, to form discrete charge trapping elements in contact with the tunneling layers and the blocking layers between the discrete charge trapping elements and the first sidewalls of the conductive strips, as described in connection with FIG. 10.

The conductive strips in the stacks of conductive strips can have second sidewalls opposite the first sidewalls. The manufacturing method can further include recessing the second sidewalls of the conductive strips relative to the second sides of the insulating strips to define second recessed regions in sides of the stacks, and forming the data storage structures including discrete charge trapping elements as described herein in the second recessed regions.

Figures 12, 13:
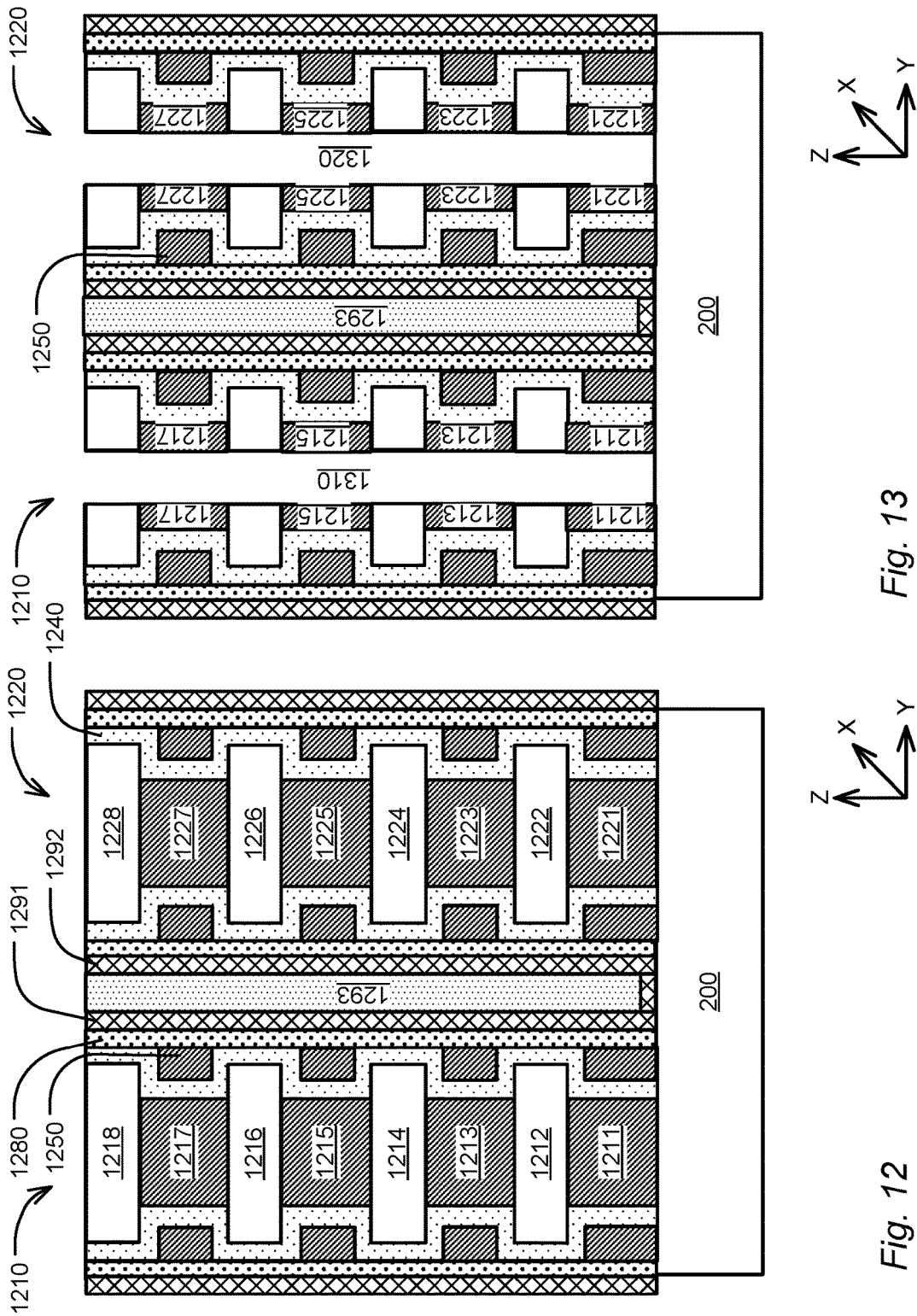
FIGS. 12-17 illustrate an example process flow for an alternative memory architecture including data storage structures including discrete charge trapping elements.

FIGS. 12-17 illustrate an example process flow for an alternative memory architecture including data storage structures including discrete charge trapping elements. FIG. 12 illustrates an architecture similar to that shown in FIG. 9. A difference is that FIG. 9 illustrates stacks of conductive strips (e.g. 211, 213, 215 and 217 in stack 210; 221, 223, 225, 227 in stack 220), where the conductive strips can include a semiconductor material, while FIG. 12 illustrates stacks of sacrificial strips (e.g. 1211, 1213, 1215 and 1217 in stack 1210; 1221, 1223, 1225, 1227 in stack 1220), where the sacrificial strips can include a material such as silicon nitride (SiN).

FIG. 12 illustrates a stage of the process flow after a sequence of process steps similar to the process steps illustrated in FIGS. 2-9, using sacrificial strips instead of conductive strips as in FIGS. 2-9. The sequence of process steps resulting in the stage illustrated in FIG. 12 includes:

Step 1: forming a plurality of stacks of sacrificial strips (e.g. 1211, 1213, 1215 and 1217 in stack 1210; 1221, 1223, 1225, 1227 in stack 1220) alternating with insulating strips (e.g. 1212, 1214, 1216 and 1218 in stack 1210; and 1222, 1224, 1226 and 1228 in stack 1220), the insulating strips in the stacks having first and second sides, and the sacrificial strips in the stacks having first sidewalls. This step is similar to the process step described in connection to FIG. 2, using sacrificial strips instead of conductive strips.

Step 2: recessing the first sidewalls of the sacrificial strips relative to the first sides of the insulating strips to define first recessed regions in sides of the stacks. This step is similar to the process step described in connection to FIG. 3, using sacrificial strips instead of conductive strips.

Step 3: forming data storage structures in the first recessed regions. This step is similar to the process steps described in connection to FIGS. 4-8. This step can include depositing blocking layers (e.g. 1240) over the first sidewalls of the sacrificial strips (e.g. e.g. 1211, 1213, 1215 and 1217 in stack 1210) in the first recessed regions; depositing charge trapping material (e.g. 1250) over the blocking layers in the first recessed regions; and depositing tunneling layers (e.g. 1280) over the charge trapping material in the first recessed regions.

Furthermore, depositing the blocking layers in Step 3 can include depositing the blocking layers over the first sides of the sacrificial strips. Depositing the charge trapping material in Step 3 can include depositing the charge trapping material over the blocking layers over the first sides of the sacrificial strips, and separating the charge trapping material between adjacent first recessed regions. Separating the charge trapping material can include removing the charge trapping material over the blocking layers over the first sides of the insulating strips, while keeping the charge trapping material in the first recessed regions.

Step 4: forming first and second channel films (e.g. 1291 and 1292) on the data storage structures on sidewalls of adjacent stacks (e.g. 1210 and 1220). This step is similar to the process steps described in connection to FIG. 9.

Step 5: depositing a dielectric material (e.g. 2193) between the first and second channel films (e.g. 1291 and 1292), the dielectric material contacting the first and second channel films on the sidewalls of the adjacent stacks (e.g. 1210 and 1220).

FIGS. 13-17 illustrate stages in the process flow to replace the sacrificial strips in the stacks with a metal material such as tungsten. FIG. 13 illustrates a stage of the process flow after etching the stacks (e.g. 1210 and 1220) to form a trench (e.g. 1310, 1320), exposing the sacrificial strips in the trench (e.g. 1211, 1213, 1215 and 1217 in trench 1310; 1221, 1223, 1225, 1227 in trench 1320).

Figure 15:
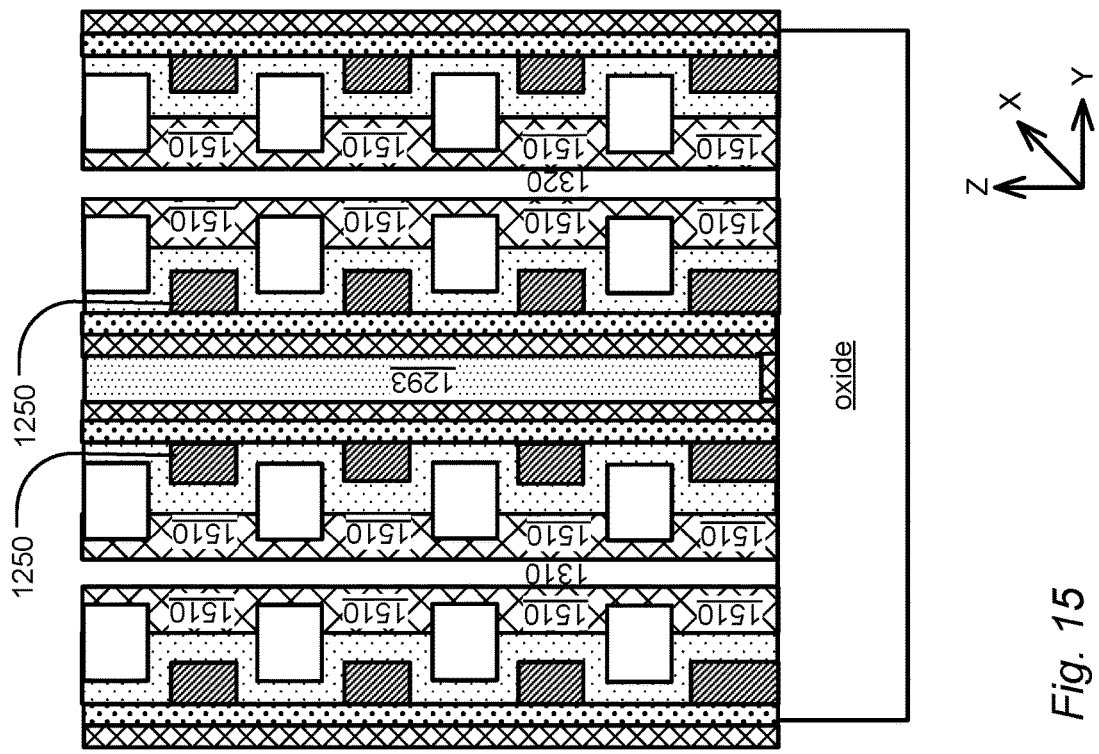
Figure 14:
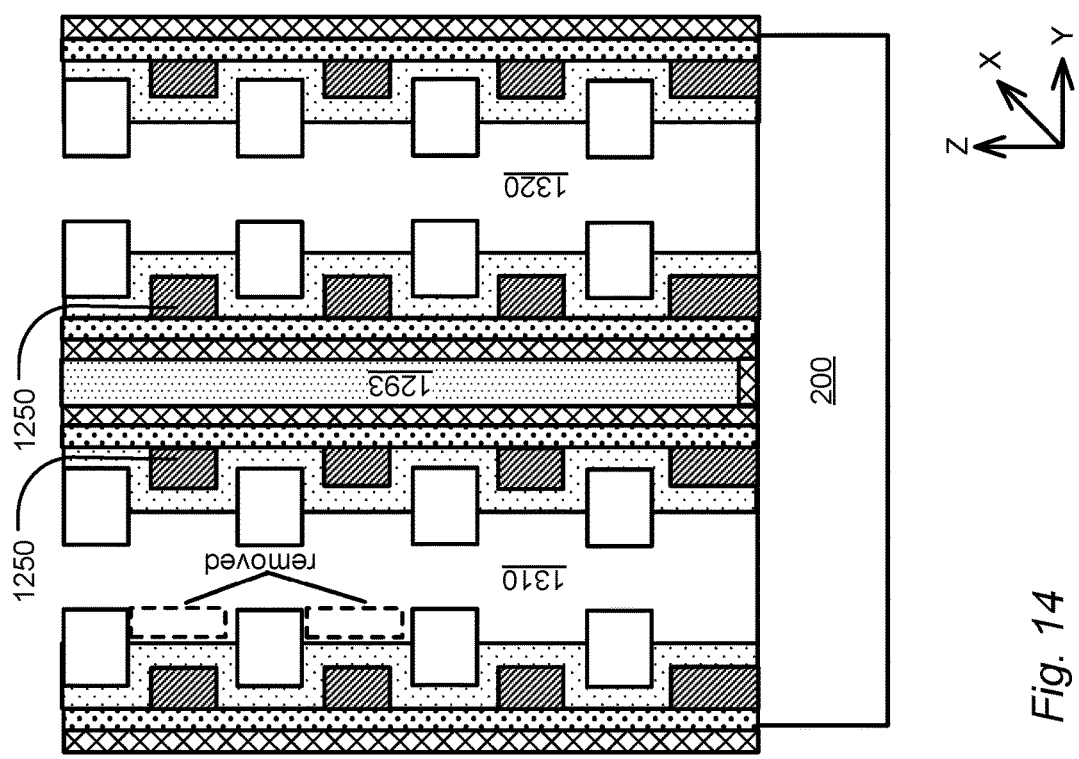

FIG. 14 illustrates a stage of the process flow after removing the sacrificial strips in the trenches (e.g. 1211, 1213, 1215 and 1217 in trench 1310; 1221, 1223, 1225, and 1227 in trench 1320). FIG. 15 illustrates a stage of the process flow after depositing the metal material (e.g. 1510) in the trenches (e.g. 1310, 1320).

Figure 17:
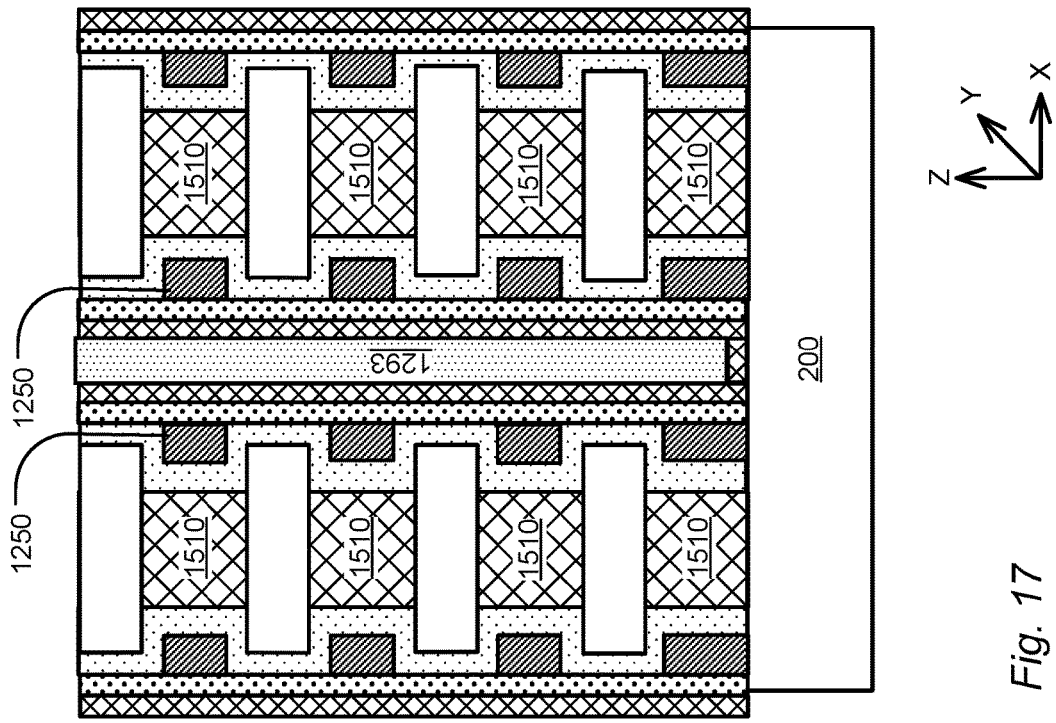
Figure 16:
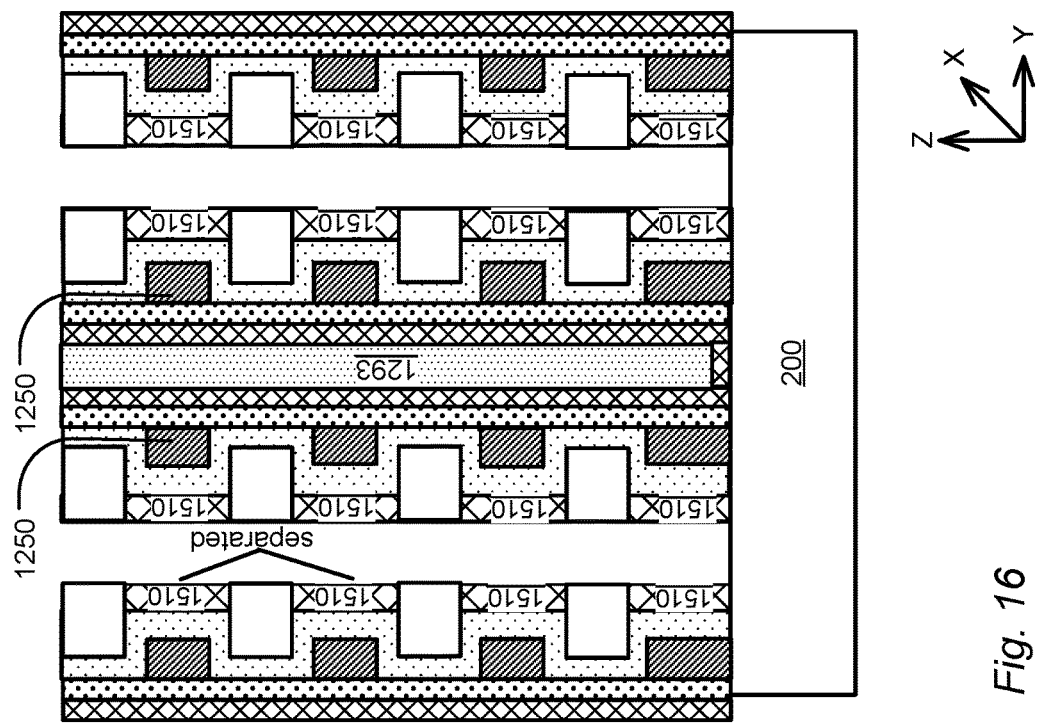

FIGS. 16 and 17 illustrate a stage of the process flow after separating the metal material (e.g. 1510) between the insulating strips in the trench, as shown in the ZY plane and the ZX plane. For instance, if the metal material includes tungsten (W), then a tungsten etch process can be applied to the metal material (e.g. 1510) in the trenches to separate the metal material between the insulating strips in the trenches.

The example process flow illustrated in FIGS. 12 through 17, using a gate replacement process, can result in an SGVC (single gate vertical channel) architecture including data storage structures including discrete charge trapping elements, and using a metal material for gates. The data storage structures are disposed at cross points of the vertical channel pillars between the stacks and the metal strips (e.g. 1510, FIG. 16) in the stacks. The data storage structures include tunneling layers in contact with the vertical channel pillars, discrete charge trapping elements in contact with the tunneling layers and blocking layers between the discrete charge trapping elements and the first sidewalls of the metal, where the discrete charge trapping elements are disposed in the first recessed regions on the first sidewalls of the metal strips. The data storage structures can include blocking layers between the discrete charge trapping elements and the second sidewalls of the metal strips, where the discrete charge trapping elements are disposed in the second recessed regions on the second sidewalls of the metal strips.

Figure 18:
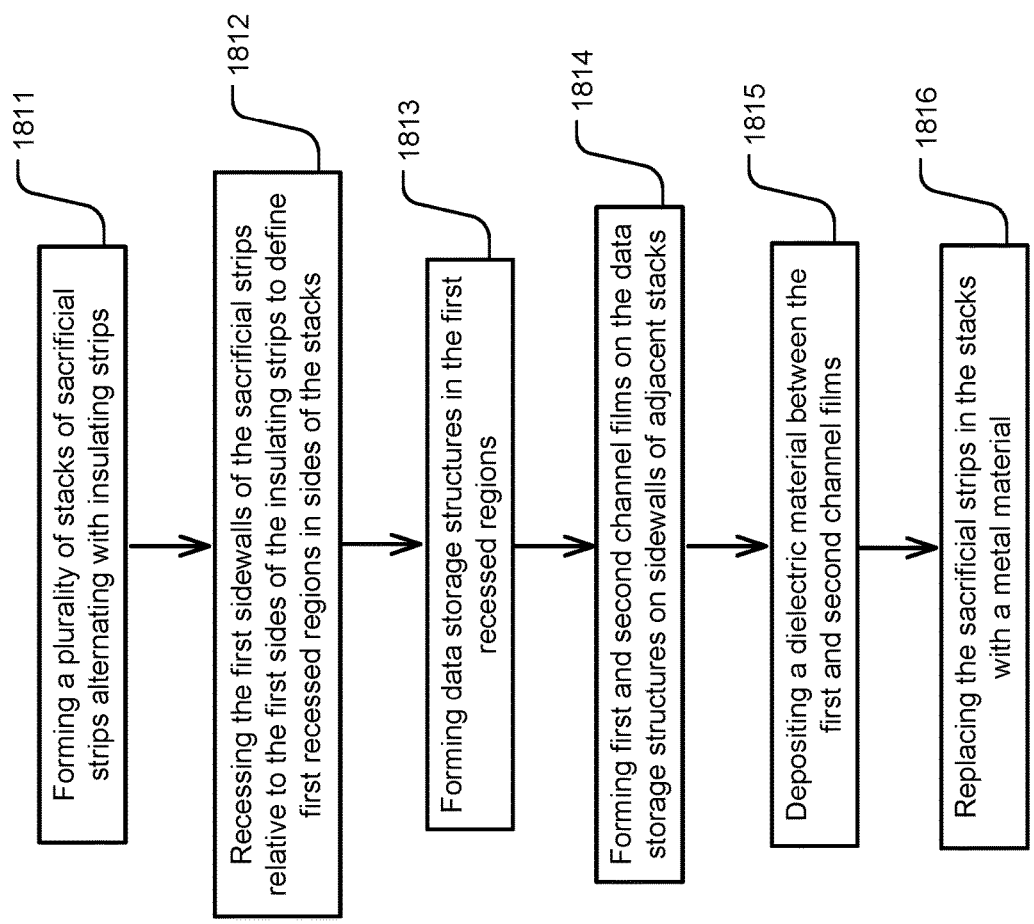
FIG. 18 is an example flow chart illustrating a manufacturing method for an alternative memory architecture including data storage structures including discrete charge trapping elements, using a gate replacement process after forming the data storage structures.

FIG. 18 is an example flow chart illustrating a manufacturing method for an alternative memory architecture, including first forming data storage structures including discrete charge trapping elements in recessed regions in sides of stacks of sacrificial strips, and then replacing the sacrificial strips in the stacks with a metal material to form metal gates. The method includes forming a plurality of stacks (e.g. 1210, 1220) of sacrificial strips (e.g. 1211, 1213, 1215 and 1217) alternating with insulating strips (e.g. 1212, 1214, 1216 and 1218), where the insulating strips in the stacks have first and second sides, and the sacrificial strips in the stacks have first sidewalls, as described in connection to FIG. 12 (Step 1811). The method includes recessing the first sidewalls of the sacrificial strips relative to the first sides of the insulating strips to define first recessed regions in sides of the stacks, as described in connection to FIG. 12 (Step 1812).

The method includes forming data storage structures in the first recessed regions (Step 1813). This step can include depositing blocking layers (e.g. 1240) over the first sidewalls of the sacrificial strips in the first recessed regions as described in connection to FIG. 12, depositing charge trapping material (e.g. 1250) over the blocking layers in the first recessed regions as described in connection to FIGS. 5-7, and depositing tunneling layers (e.g. 1280) over the charge trapping material in the first recessed regions as described in connection to FIG. 12.

Furthermore, depositing the blocking layers can include depositing the blocking layers over the first sides of the insulating strips, and depositing the charge trapping material can include depositing the charge trapping material over the blocking layers over the first sides of the insulating strips, and separating the charge trapping material between adjacent first recessed regions. Separating the charge trapping material can include removing the charge trapping material over the blocking layers over the first sides of the insulating strips, while keeping the charge trapping material in the first recessed regions.

The method includes forming vertical channel pillars by forming first and second channel films on the data storage structures on sidewalls of adjacent stacks (Step 1814), and depositing a dielectric material between the first and second channel films, the dielectric material contacting the first and second channel films on the sidewalls of the adjacent stacks (Step 1815).

The method can further include etching to isolate the data storage structures along the sacrificial strips, to form discrete charge trapping elements in contact with the tunneling layers and the blocking layers between the discrete charge trapping elements and the first sidewalls of the sacrificial strips, as described in connection with FIG. 10, when the stacks include sacrificial strips (e.g. 1217 and 1227, FIG. 12) instead of conductive strips (e.g. 217 and 227, FIG. 10).

The sacrificial strips in the stacks of sacrificial strips can have second sidewalls opposite the first sidewalls. The manufacturing method can further include recessing the second sidewalls of the sacrificial strips relative to the second sides of the insulating strips to define second recessed regions in sides of the stacks, and forming the data storage structures including discrete charge trapping elements as described herein in the second recessed regions.

The method includes replacing the sacrificial strips in the stacks with a metal material (Step 1816). The replacing step can include etching the stacks (e.g. 1210 and 1220) to form a trench (e.g. 1310, 1320, FIG. 13), exposing the sacrificial strips in the trench (e.g. 1211, 1213, 1215 and 1217 in trench 1310; 1221, 1223, 1225, 1227 in trench 1320); removing the sacrificial strips in the trench (e.g. FIG. 14); depositing the metal material (e.g. 1510, FIG. 14) in the trench; and separating the metal material between the insulating strips in the trench (FIGS. 16 and 17), as described in connection to FIGS. 13-17.

Figure 19:
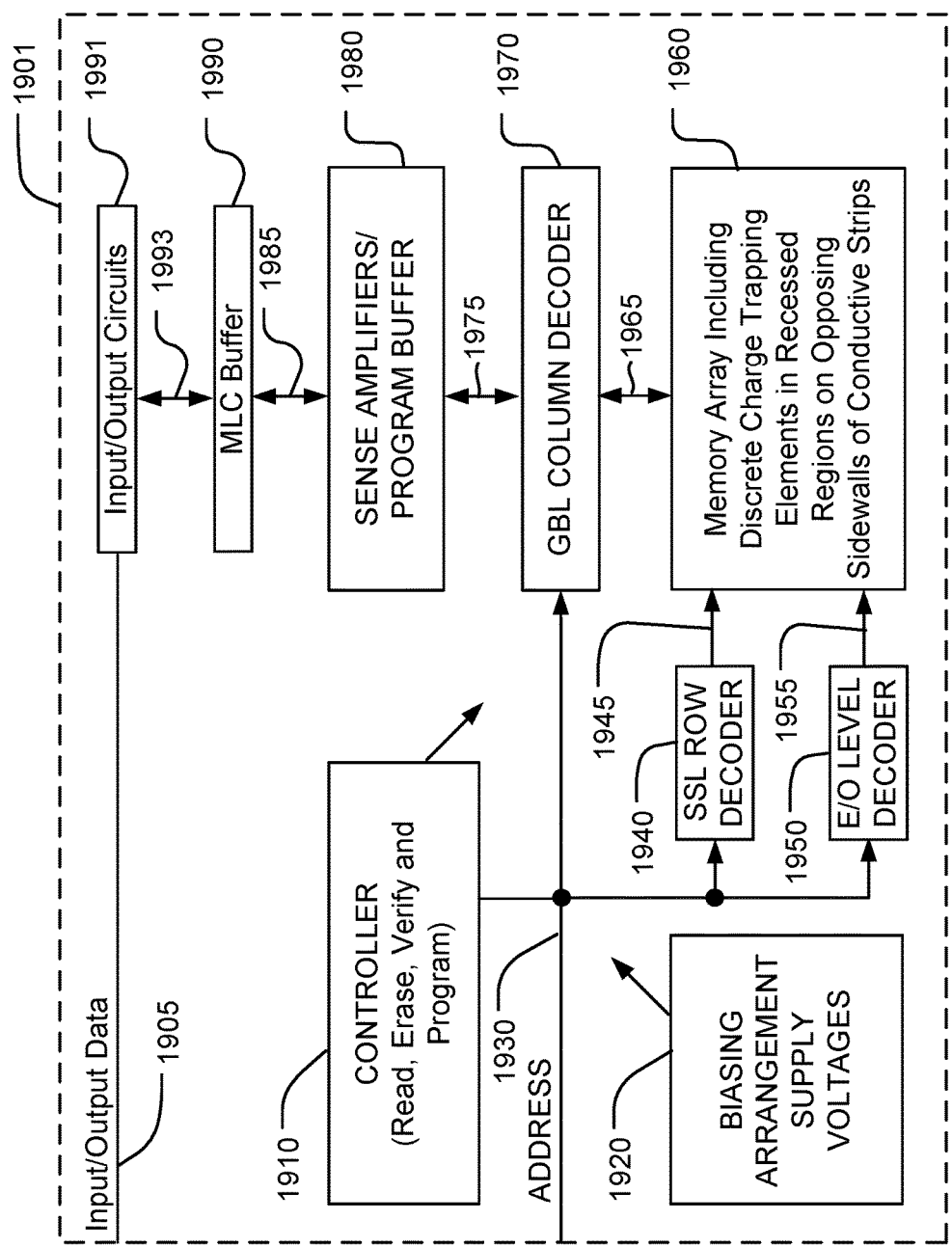
FIG. 19 is a block diagram of an integrated circuit memory including a 3D memory array including discrete charge trapping elements in recessed regions on sidewalls of conductive strips.

FIG. 19 is a block diagram of an integrated circuit memory including a 3D memory array including discrete charge trapping elements in recessed regions on sidewalls of conductive strips. The integrated circuit 1901 includes a memory array 1960 including one or more memory blocks as described herein with single gate vertical channel cells including data storage structures including discrete charge trapping elements in recessed regions on opposing sidewalls of conductive strips.

The data storage structures are disposed at cross points of the vertical channel pillars between the stacks and the conductive strips in the stacks. The data storage structures include tunneling layers in contact with the vertical channel pillars, discrete charge trapping elements in contact with the tunneling layers and blocking layers between the discrete charge trapping elements and the first sidewalls of the conductive strips, where the discrete charge trapping elements are disposed in the first recessed regions on the first sidewalls of the conductive strips. The data storage structures can include blocking layers between the discrete charge trapping elements and the second sidewalls of the conductive strips, where the discrete charge trapping elements are disposed in the second recessed regions on the second sidewalls of the conductive strips. In embodiments, the conductive strips can include a semiconductor material such as polysilicon or a metal material such as tungsten.

An SSL decoder 1940 is coupled to a plurality of SSL lines 1945, arranged in the memory array 1960. An even/odd level decoder 1950 is coupled to a plurality of even/odd word lines 1955. As described in connection to FIG. 9, an even/odd level decoder 1950 can be coupled to a plurality of even/odd word lines such as the conductive strips (e.g. 211, 213, 215, 217, 221, 223, 225, and 227) in the odd stack 210 and the even stack 220 that can act as word lines. A global bit line column decoder 1970 is coupled to a plurality of global bit lines 1965 arranged along columns in the memory array 1960 for reading data from and writing data to the memory array 1960. Addresses are supplied on bus 1930 from control logic 1910 to decoder 1970, decoder 1940 and decoder 1950. Sense amplifier and program buffer circuits 1980 are coupled to the column decoder 1970, in this example via first data lines 1975. The program buffer in circuits 1980 can store program codes for multiple-level programming to indicate program or inhibit states for selected bit lines. The column decoder 1970 can include circuits for selectively applying program and inhibit voltages to bit lines in the memory in response to the data values in the program buffer.

Sensed data from the sense amplifier/program buffer circuits are supplied via second data lines 1985 to multi-level data buffer 1990, which is in turn coupled to input/output circuits 1991 via a data path 1993. Also, input data is applied in this example to the multi-level data buffer 1990 for use in support of multiple-level program operations for each of single gate vertical channel cells in the array.

Input/output circuits 1991 drive the data to destinations external to the integrated circuit 1901. Input/output data and control signals are moved via data bus 1905 between the input/output circuits 1991, the control logic 1910 and input/output ports on the integrated circuit 1901 or other data sources internal or external to the integrated circuit 1901, such as a general purpose processor or special purpose application circuitry, or a combination of modules providing system-on-a-chip functionality supported by the memory array 1960.

In the example shown in FIG. 19, control logic 1910, using a bias arrangement state machine, controls the application of supply voltages generated or provided through the voltage supply or supplies in block 1920, such as read, erase, verify and program bias voltages. The control logic 1910 is coupled to the multi-level buffer 1990 and the memory array 1960. The control logic 1910 includes logic to control multiple-level program operations.

The control logic 1910 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
a plurality of stacks of conductive strips alternating with insulating strips, the insulating strips in the stacks having first and second sides, and the conductive strips in the stacks having first sidewalls recessed relative to the first sides of the insulating strips which define first recessed regions in sides of the stacks;
vertical channel pillars disposed between the stacks, the vertical channel pillars having first and second channel films disposed on adjacent stacks in the plurality of stacks and a dielectric material physically separating the first and second channel films at levels of data storage structures, the adjacent stacks being physically separated from each other;
the data storage structures at cross points of the vertical channel pillars between the stacks and the conductive strips in the stacks, the data storage structures including tunneling layers in contact with the first and second channel films in the vertical channel pillars, discrete charge trapping elements in contact with the tunneling layers, and blocking layers between the discrete charge trapping elements and the first sidewalls of the conductive strips and between the tunneling layers and the first sides of the insulating strips, the blocking layers continuous across and in contact with the first sides of the insulating strips vertically between adjacent conductive strips in the stacks, the discrete charge trapping elements disposed in the first recessed regions on the first sidewalls of the conductive strips; and
insulating structures disposed between and in contact with adjacent conductive strips, the conductive strips extending in a first direction, the insulating structures having a width in a second direction orthogonal to the first direction, wherein the data storage structures are disposed within the width between adjacent conductive strips.

2. The memory device of claim 1, wherein the discrete charge trapping elements disposed in the first recessed regions are dielectric charge trapping elements.

3. The memory device of claim 1, wherein the conductive strips in the stacks have second sidewalls opposite the first sidewalls recessed relative to the second sides of the insulating strips which define second recessed regions on the second sidewalls of the conductive strips; and
the data storage structures include discrete charge trapping elements disposed in the second recessed regions in contact with the tunneling layers, and blocking layers between the discrete charge trapping elements in the second recessed regions and the second sidewalls of the conductive strips.

4. The memory device of claim 3, wherein the discrete charge trapping elements disposed in the second recessed regions are dielectric charge trapping elements.

5. The memory device of claim 1, wherein the dielectric material comprises a gap.

6. The memory device of claim 1, wherein the conductive strips in the plurality of stacks of conductive strips include a metal material.

7. The memory device of claim 1, wherein the first sidewalls of the conductive strips in the stacks are straight, and the vertical channel pillars disposed between the stacks are parallel to the first sidewalls.

8. A memory device, comprising:
a plurality of stacks of conductive strips alternating with insulating strips, the insulating strips in the stacks having first and second sides, and the conductive strips in the stacks having first sidewalls recessed relative to the first sides of the insulating strips which define first recessed regions in sides of the stacks and having second sidewalls opposite the first sidewalls recessed relative to the second sides of the insulating strips which define second recessed regions in sides of the stacks;
vertical channel pillars disposed between the stacks, the vertical channel pillars having first and second channel films disposed on adjacent stacks in the plurality of stacks and a dielectric material physically separating the first and second channel films at levels of data storage structures, the adjacent stacks being physically separated from each other;
the data storage structures at cross points of the vertical channel pillars between the stacks and the conductive strips in the stacks, the data storage structures including tunneling layers in contact with the first and second channel films in the vertical channel pillars, discrete charge trapping elements in contact with the tunneling layers, and blocking layers between the discrete charge trapping elements and the first sidewalls of the conductive strips, between the discrete charge trapping elements and the second sidewalls of the conductive strips, between the tunneling layers and the first sides of the insulating strips, and between the tunneling layers and the second sides of the insulating strips, the blocking layers continuous across and in contact with the first sides of the insulating strips vertically between adjacent conductive strips in the stacks, the blocking layers continuous across and in contact with the second sides of the insulating strips vertically between adjacent conductive strips in the stacks, the discrete charge trapping elements disposed in the first recessed regions on the first sidewalls of the conductive strips and disposed in the second recessed regions on the second sidewalls of the conductive strips,
wherein the vertical channel pillars are arranged so that a first row of the vertical channel pillars disposed on the first sidewalls of a particular stack of conductive strips is offset in a row direction from a second row of the vertical channel pillars disposed on the second sidewalls of the particular stack of conductive strips; and
insulating structures disposed between and in contact with adjacent conductive strips, the conductive strips extending in a first direction, the insulating structures having a width in a second direction orthogonal to the first direction, wherein the data storage structures are disposed within the width between adjacent conductive strips.

9. The memory device of claim 8, wherein the discrete charge trapping elements are dielectric charge trapping elements.

10. The memory device of claim 8, wherein the dielectric material comprises a gap.

11. The memory device of claim 8, wherein the conductive strips in the plurality of stacks of conductive strips include a metal material.

12. A manufacturing method, comprising:
forming a plurality of stacks of conductive strips alternating with insulating strips, the insulating strips in the stacks having first and second sides, and the conductive strips in the stacks having first sidewalls;
recessing the first sidewalls of the conductive strips relative to the first sides of the insulating strips to define first recessed regions in sides of the stacks;
forming data storage structures in the first recessed regions, including forming blocking layers between tunneling layers and the first sides of the insulating strips in the stacks, the blocking layers continuous across and in contact with the first sides of the insulating strips vertically between adjacent conductive strips;
forming first and second channel films on the data storage structures on sidewalls of adjacent stacks, the adjacent stacks being physically separated from each other;
depositing a dielectric material between the first and second channel films, the dielectric material physically separating the first and second channel films on the sidewalls of the adjacent stacks at levels of the data storage structures; and
forming insulating structures disposed between and in contact with adjacent conductive strips, the conductive strips extending in a first direction, the insulating structures having a width in a second direction orthogonal to the first direction, wherein the data storage structures are disposed within the width between adjacent conductive strips.

13. The manufacturing method of claim 12, said forming the data storage structures comprising:
depositing the blocking layers over the first sidewalls of the conductive strips in the first recessed regions and over the first sides of the insulating strips in the stacks;
depositing charge trapping material over the blocking layers in the first recessed regions; and
depositing the tunneling layers over the charge trapping material in the first recessed regions and over the blocking layers over the first sides of the insulating strips in the stacks.

14. The manufacturing method of claim 13, wherein the charge trapping material is dielectric charge trapping material.

15. The manufacturing method of claim 13, comprising:
said depositing the blocking layers including depositing the blocking layers over the first sides of the insulating strips; and
said depositing the charge trapping material including depositing the charge trapping material over the blocking layers over the first sides of the insulating strips; and separating the charge trapping material between adjacent first recessed regions.

16. The manufacturing method of claim 15, said separating the charge trapping material including removing the charge trapping material over the blocking layers over the first sides of the insulating strips, while keeping the charge trapping material in the first recessed regions.

17. The manufacturing method of claim 12, comprising:
etching to isolate the data storage structures along the conductive strips, to form discrete charge trapping elements in contact with the tunneling layers and the blocking layers between the discrete charge trapping elements and the first sidewalls of the conductive strips.

18. The manufacturing method of claim 12, wherein the conductive strips in the stacks of conductive strips have second sidewalls opposite the first sidewalls, the manufacturing method comprising:
recessing the second sidewalls of the conductive strips relative to the second sides of the insulating strips to define second recessed regions in sides of the stacks; and
forming the data storage structures in the second recessed regions.

19. The manufacturing method of claim 18,
etching to isolate the first and second channel films and the dielectric material between the first and second channel films along the conductive strips, to form vertical channel pillars between the stacks, so that a first row of the vertical channel pillars disposed on the first sidewalls of a particular stack of conductive strips is offset in a row direction from a second row of the vertical channel pillars disposed on the second sidewalls of the particular stack of conductive strips.

20. The manufacturing method of claim 12, said depositing a dielectric material between the first and second channel films including leaving a gap between the first and second vertical channel films.

21. A manufacturing method, comprising:
forming a plurality of stacks of sacrificial strips alternating with insulating strips, the insulating strips in the stacks having first and second sides, and the sacrificial strips in the stacks having first sidewalls;
recessing the first sidewalls of the sacrificial strips relative to the first sides of the insulating strips to define first recessed regions in sides of the stacks;
forming data storage structures in the first recessed regions, including forming blocking layers between tunneling layers and the first sides of the insulating strips in the stacks, the blocking layers continuous across and in contact with the first sides of the insulating strips vertically between adjacent conductive strips;
forming first and second channel films on the data storage structures on sidewalls of adjacent stacks, the adjacent stacks being physically separated from each other;
depositing a dielectric material between the first and second channel films, the dielectric material physically separating the first and second channel films on the sidewalls of the adjacent stacks at levels of the data storage structures;
replacing the sacrificial strips in the stacks with a metal material; and
forming insulating structures disposed between and in contact with adjacent conductive strips, the conductive strips extending in a first direction, the insulating structures having a width in a second direction orthogonal to the first direction, wherein the data storage structures are disposed within the width between adjacent conductive strips.

22. The manufacturing method of claim 21, said forming the data storage structures comprising:
depositing the blocking layers over the first sidewalls of the sacrificial strips in the first recessed regions and over the first sides of the insulating strips in the stacks;
depositing charge trapping material over the blocking layers in the first recessed regions; and
depositing the tunneling layers over the charge trapping material in the first recessed regions and over the blocking layers over the first sides of the insulating strips in the stacks.

23. The manufacturing method of claim 22, wherein the charge trapping material is dielectric charge trapping material.

24. The manufacturing method of claim 21, said depositing a dielectric material between the first and second channel films including leaving a gap between the first and second vertical channel films.

25. The manufacturing method of claim 21, said replacing comprising:
etching the stacks to form a trench, exposing the sacrificial strips in the trench;
removing the sacrificial strips in the trench;
depositing the metal material in the trench; and
separating the metal material between the insulating strips in the trench.

* * * * *